United States Patent [19]
Ueda

[11] Patent Number: 5,194,807
[45] Date of Patent: Mar. 16, 1993

[54] METHOD AND APPARATUS FOR COMPENSATING FOR VARIATIONS IN MAGNETIC FLUX SUPPLIED TO A SQUID SUPERCONDUCTING LOOP INPUT COIL BY APPLYING A MODULATED SIGNAL TO A MODULATION COIL THEREOF

[75] Inventor: Tomoaki Ueda, Kyoto, Japan

[73] Assignee: Daikin Industries, Ltd., Japan

[21] Appl. No.: 755,572

[22] Filed: Sep. 5, 1991

[30] Foreign Application Priority Data

Sep. 7, 1990 [JP] Japan .................. 2-237958

[51] Int. Cl.⁵ .......................... G01R 33/035
[52] U.S. Cl. .................. 324/248; 307/306; 505/846
[58] Field of Search ............ 324/248; 307/306, 309; 505/846

[56] References Cited
U.S. PATENT DOCUMENTS

| | | | |
|---|---|---|---|
| 4,489,274 | 12/1984 | Berlincourt | 324/248 |
| 4,663,590 | 5/1987 | Gershenson et al. | 324/248 |
| 4,851,776 | 7/1989 | Goto et al. | 324/248 |
| 5,093,618 | 3/1992 | Goto et al. | 324/248 |

FOREIGN PATENT DOCUMENTS

| | | | |
|---|---|---|---|
| 0196480 | 11/1984 | Japan | 324/248 |
| 0050975 | 2/1989 | Japan | 324/248 |

Primary Examiner—Gerard R. Strecker
Attorney, Agent, or Firm—Beveridge, DeGrandi & Weilacher

[57] ABSTRACT

A constant bias voltage is applied to plural superconducting quantum interference devices which are interconnected in parallel. Output currents from the superconducting quantum interference devices are supplied in added condition. Maximal-sequence codes are modulated by a modulation current corresponding to each device, and the modulated maximal-sequence codes are supplied to the modulation coil of each corresponding superconducting quantum interference device. The added output current is demodulated for each device by a maximal-sequence code which is phase shifted by the same quantity as the maximal-sequence code for modulation for each device.

8 Claims, 7 Drawing Sheets

METHOD AND APPARATUS FOR COMPENSATING FOR VARIATIONS IN MAGNETIC FLUX SUPPLIED TO A SQUID SUPERCONDUCTING LOOP INPUT COIL BY APPLYING A MODULATED SIGNAL TO A MODULATION COIL THEREOF

BACKGROUND OF THE INVENTION

The present invention relates to magnetic flux locking methods and apparatus. More particularly, the present invention relates to methods and apparatus for supplying a modulation signal to a modulation coil so as to compensate for variations in the magnetic flux which is guided to a superconducting loop of a superconducting quantum interference device (hereinafter referred to as SQUID) by an input coil when the SQUID is operated and housed in a casing which is cooled by a refrigerator to a temperature below the critical temperature for superconduction.

It is known that a SQUID is capable of detecting magnetic flux with extremely high sensitivity. With attention to this characteristic, a SQUID is applied to various apparatus which are used in various technical fields. A SQUID is classified as an rf-SQUID if it has only on Josephson junction (hereinafter referred to as JJ) and as a dc-SQUID if it has two JJs. The rf-SQUID was generally used in the past years, while the dc-SQUID is being widely used in recent years because two JJs having similar characteristics can be obtained due to improvements in thin film manufacturing engineering in recent years.

Figure 7:
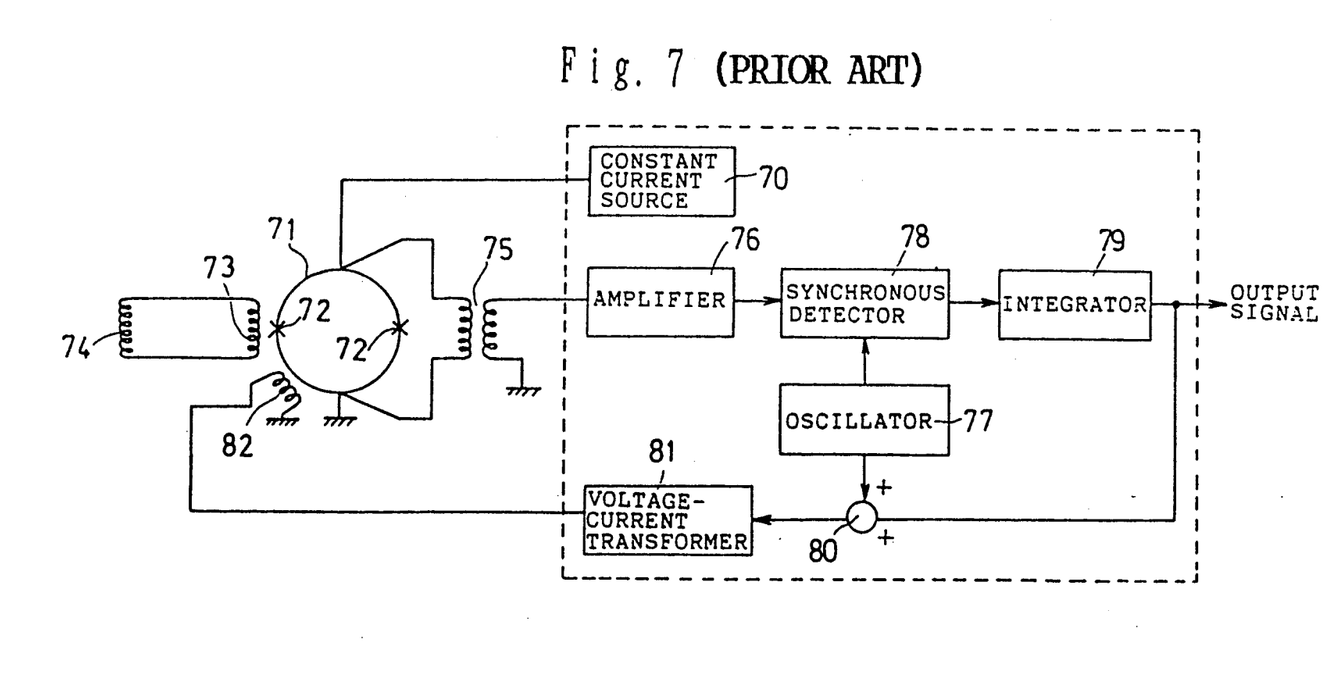
FIG. 7 is an electrical diagram for explaining the principle of a dc-SQUID flux meter.

FIG. 7 is an electric diagram for explaining the principle of a dc-SQUID flux meter.

The dc-SQUID includes a superconducting loop 71 and two JJs 72 which are provided at predetermined positions on the superconducting loop 71. A bias current is supplied to the opposite positions on the superconducting loop 71 with respect to the JJs 72 by a constant current source 70. An input coil 73, which is interconnected with a pickup coil 74 for detecting the magnetic flux of an object under measurement, is provided at a closed position on the superconducting loop 71. A voltage is output from the opposite positions on the superconducting loop 71 with respect to the JJs 72, the output voltage is transformed by a voltage transformation transformer 75 and then is amplified by an amplifier 76. The amplified voltage is demodulated by a synchronous detector 78 based on the signal output from an oscillator 77, then the demodulated signal is integrated by an integrator 79 so as to output a voltage which is proportional to the exterior magnetic flux. Further, the output signal output from the integrator 79 and the signal output from the oscillator 77 are added by an adder 80. The added signal is transformed into a feedback current by a voltage-current transformer 81, and the feedback current is supplied to a modulation coil 82 so as to eliminate the exterior magnetic flux detected by the pickup coil 74.

Figure 8:
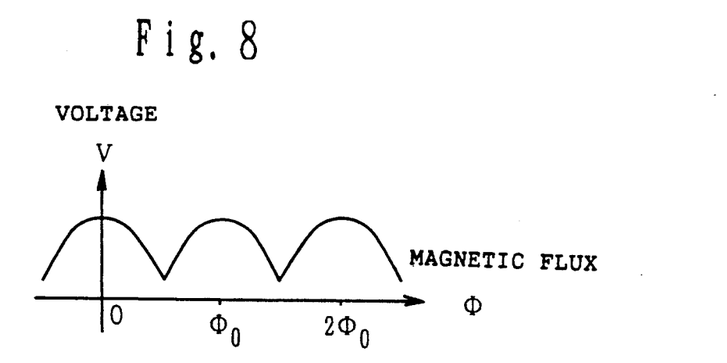
FIG. 8 is a diagram illustrating a magnetic flux-voltage transformation coefficient of a SQUID.

When the dc-SQUID is employed, interlinkage magnetic flux cannot be measured because the transformation coefficient of magnetic flux to voltage cyclically alternates based on the size of the interlinkage magnetic flux (refer to FIG. 8). However, a magnetic flux locked loop (hereinafter referred to as a FLL) maintains the magnetic flux at a point having the highest transformation rate of magnetic flux to voltage. Consequently, the interlinkage magnetic flux of the superconducting loop 71 can be measured when the dc-SQUID is integrated into a FLL having the arrangement in FIG. 7. More particularly, the magnetic flux which has the same size, and polarity which is the reverse of the externally supplied magnetic flux to the superconducting loop 71 through the pickup coil 74 and input coil 73, is fed back by the modulation coil 82 so as to cancel the external magnetic flux. The external magnetic flux can be measured by monitoring the feedback current supplied to the modulation coil 82.

When SQUIDs and FLLs are provided for multichannel application, the number of electrical connection lines remarkably increases with the increase in the number of channels (when the number of channels is n, the number of lines is 6n). The increase in the number of lines causes thermal contact to be greatly defective. Thereby the connecting section becomes greatly enlarged. Disadvantages arise in that liquid helium loss becomes great when a refrigerating system using liquid helium is employed, and in that refrigerating capacity of the refrigerator should be increased when the refrigerating system using the refrigerator is employed. Disadvantages further arise in that the measurement accuracy for measuring the magnetic flux is lowered because the magnitude of crosstalk between channels increases to a considerable value due to the arrangement of plural magnetic flux measurement system in closed condition.

SUMMARY OF THE INVENTION

It is an object of the present invention to operate plural SQUIDs in a locked magnetic flux condition when the SQUIDs are housed and operated in one refrigeration casing.

It is another object of the present invention to decrease the number of lines to a great extent which are used for plural SQUIDs.

To perform the objects above-mentioned, a magnetic flux locking method according to the present invention comprises the steps of;

applying the same constant-voltage to superconducting loops of plural SQUIDs, modulating each pseudo noise for modulation based on the corresponding modulation signal for compensating for the variations in the magnetic flux which is guided to the superconducting loop by an input coil, the pseudo noise for modulation having significant autocorrelation characteristics and being phase shifted by a predetermined quantity, supplying the modulated pseudo noise for modulation to a modulation coil, adding output signals of the plural SQUIDs to obtain an added output signal, demodulating the added output signal based on pseudo noises for demodulation which are phase shifted by the same quantities as the corresponding pseudo noises for modulation so as to extract the output signal of each SQUID from the added output signal.

When this magnetic flux locking method is employed, the same constant-voltage is applied to the superconducting loops of the SQUIDs as the magnetic flux guided to the superconducting loop of each SQUID is maintained constant by supplying the modulation signal to the modulation coil for compensating for the variations in the quantity of the magnetic flux guided by the input coil to the superconducting loop of each SQUID, which SQUIDs are housed in a casing that is refrigerated to a temperature below the critical temperature for superconduction. The output signals of the plural SQUIDs are added to obtain an added output signal. Therefore, the number of lines which are used for applying the constant-voltage and used for outputting the output signal is decreased to a minimum number (the number is 4) regardless of an increase in the number of SQUIDs used. As a result, the number of lines is decreased to a great extent, and defectiveness of the thermal contact is decreased to a great extent. When the magnetic flux is actually measured, each output signal corresponding to each SQUID should be extracted from the added output signal. The present invention securely separates each output current of each corresponding SQUID due to significant auto-correlation characteristics of the pseudo noise because the present invention modulates pseudo noise for modulation based on the modulation signal, supplies the modulated pseudo noise to the modulation coil, and demodulates the added output signal based on a pseudo noise for demodulation which has the same phase shift quantity as that of the pseudo noise for modulation. Additionally, the influence of crosstalk is securely eliminated because signals which correspond to the pseudo noises having different phase shift quantities from that of the corresponding pseudo noise for modulation, are securely eliminated.

It is preferable that the pseudo noise for modulation and the pseudo noise for demodulation may be modulated to balance the percentages of positive codes and negative codes.

When this magnetic flux locking method is employed, although the pseudo noise is not balanced for the percentages of positive codes and negative codes, the modulated pseudo noise is balanced for the percentages of positive codes and negative codes. Therefore, the magnetic flux locking operation is performed well.

It is also preferable that the pseudo noise for demodulation is obtained based on the difference between the pseudo noise for modulation and another pseudo noise having a predetermined phase shift quantity which is not used for modulation.

When this magnetic flux locking method is employed, multivalued signals are securely restored by using the pseudo noise which is not used for modulation, as a standard signal. Therefore, magnetic flux detection signals with high accuracy are obtained.

It is further preferable that the pseudo noise is a maximal-sequence code. In this case, the maximal-sequence code must have a code length longer than the total number of SQUIDs used.

When a maximal-sequence code is employed as the pseudo noise, the pseudo noise having a code length corresponding to the number of SQUIDs can easily be generated and can easily be phased shifted. Therefore, a change in the number of SQUIDs can easily be dealt with. As is apparent from the foregoing, a pseudo noise having significant auto-correlation characteristics other than the maximal-sequence code can be employed.

To perform the objects above-mentioned, a magnetic flux locking apparatus according to the present invention comprises;

a constant bias voltage applying source for applying the same constant-voltage to superconducting loops of plural SQUIDs, modulation means for modulating, for each SQUID, pseudo noise for modulation based on a modulation signal for each SQUID for compensating for the variations in the magnetic flux which is guided by an input coil to the superconducting loop of each SQUID, the pseudo noises for modulation each having significant auto-correlation characteristics and being phase shifted by a predetermined quantity, output means for adding the output signals of the SQUIDs and for outputting the added output signal, and demodulation means for demodulating the added output signal based on a pseudo noise for demodulation for each SQUID, each pseudo noise for demodulation being phase shifted by the same quantity as the corresponding pseudo noise for modulation so as to extract the output current of each corresponding SQUID from the added output signal.

When this magnetic flux locking apparatus is employed, the same constant-voltage is applied by the constant bias voltage applying source to the superconducting loops of the SQUIDs as the magnetic flux guided to the superconducting loop of each SQUID is maintained constant by supplying a modulation current to the modulation coil for compensating for the variations in the quantity of the magnetic flux guided by the input coil to the superconducting loop of each SQUID, which SQUIDs are housed in a casing that is refrigerated to a temperature below the critical temperature for superconduction. The output signals of the plural SQUIDs are added and the added output signal is output by the output means. Therefore, the number of lines which are used for applying the constant-voltage and used for outputting the output current is decreased to a minimum number (the number is 4) regardless of an increase in the number of the SQUIDs used. As a result, the number of lines is decreased to a great extent, and the connector for interconnecting the lines is prevented from being large so as to cause a decrease of defectiveness of the thermal contact to a great extent. When the magnetic flux is actually measured, each output signal corresponding to each SQUID should be extracted from the added output signal. The present invention securely separates each output signal of each corresponding SQUID due to significant auto-correlation characteristics of the pseudo noises because the modulation means modulate pseudo noises for modulation based on the modulation signal and supply modulated pseudo noises to the modulation coils, and demodulation means which demodulate the added output signal based on the pseudo noises for demodulation which have the same phase shift quantities as that of the pseudo noises for modulation. Additionally, the influence of crosstalk is securely eliminated because signals which correspond to the pseudo noises have different phase shift quantities from that of the corresponding pseudo noises for modulation.

It is preferable that the pseudo noise for modulation and the pseudo noise for demodulation may be modulated to balance the percentages of positive codes and negative codes.

When this magnetic flux locking apparatus is employed, although the pseudo noise is not balanced for the percentages of the positive codes and the negative codes, the modulated pseudo noise is balanced for the percentages of positive codes and negative codes. Therefore, the magnetic flux locking operation is performed well.

It is also preferable that the pseudo noise for demodulation is obtained based on the difference between the pseudo noise for modulation and another pseudo noise having a predetermined phase shift quantity which is not used for modulation.

When this magnetic flux locking apparatus is employed, multivalued signals are securely restored by using the pseudo noise which is not used for modulation, as a standard signal. Therefore, magnetic flux detection signals with high accuracy are obtained.

It is further preferably that the pseudo noise is a maximal-sequence code. In this case, the maximal-sequence code must have a code length longer than the total number of SQUIDs used.

When a maximal-sequence code is employed as the pseudo noise, the pseudo noise having a code length corresponding to the number of SQUIDs can easily be generated and can easily be phase shifted. Therefore, a change in the number of SQUIDs can easily be dealt with. As is apparent from the foregoing, a pseudo noise having significant auto-correlation characteristics other than the maximal-sequence code can be employed.

More specifically, a maximal-sequence code is the longest code sequence within codes which can be generated by shift registers having a predetermined number of stages or a feedback code generator made of delay devices, and is so called the maximal periodic sequences or the longest sequences. The maximal-sequence code may be in the form of a modulo-$j$ code where $j$ is an arbitrary number; a binary system code is used in the following explanation. The binary system code has the following characteristics:

(1) The difference between the number of appearances of "0" and the number of appearances of "1" within one period of a series is only 1 bit. That is, when a binary system code having a bit length of $2^n - 1$ is employed, the number of appearances of "1" is $2^n - 1$, while the number of appearances of "0" is $2^n 1 - 1$. Specifically, when $n = 3$, the binary system code is "1 0 1 1 1 0 0" for example, and the number of appearances of "1" is greater than that of "0" by 1.

(2) The statistical distribution of "0" and "1" is constant. The relative position of strings of "0" and "1" vary depending on the binary system code, but the number of appearances of a string having a predetermined length is constant for all binary system codes which have the same bit length.

Figure 5:
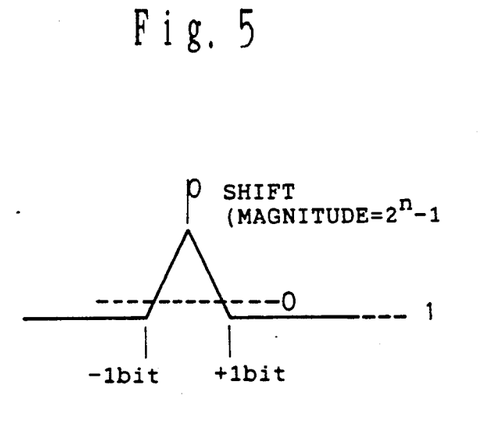
FIG. 5 is a diagram for explaining widely known characteristics of a maximal-sequence code.

(3) Referring to FIG. 5, the auto-correlation value of the binary system code is $2^n - 1$ (which is equal to the bit length) for 0 bit shift, while the auto-correlation value of the binary system code is $-1$ for an arbitrary number of bit shifts other than the bit shift range of $0 \pm 1$. The auto-correlation value of $-1$ is obtained by counting the number of coincidence portions, and the value of $-1$ indicates that the number of dissonances is greater than the number of coincidences by 1. Further, the auto-correlation value varies linearly from $-1$ to $2^n - 1$ within the bit shift range of $0 \pm 1$.

(4) Summation with a modulo-2 of an original binary system code and a phase shifted original binary system code with a predetermined phase shift quantity is another phase shifted original binary system code which phase shift quantity is different from the predetermined phase shift quantity.

(5) All inner states which are able to be obtained by an n-steps shift register generator appear in a binary system code at a predetermined clock time within one period. That is, each inner state appears only one time, and within only one clock time.

It is widely known that noise has significant auto-correlation characteristics and auto-correlation values of noise are negligible when the noise is shifted slightly. The maximal-sequence code can be used as a pseudo noise because the maximal-sequence code has a characteristic similar to the characteristic mentioned above following lengthening of the bit length.

The inventor advanced the research for pseudo noises represented by maximal-sequence codes and found new characteristics as follows:

When the code of "0" in maximal-sequence codes is replaced with the code of "$-1$", cross-correlation of a standard maximal-sequence code with a serial code which is obtained by convoluting plural maximal-sequence codes, each maximal sequence code being obtained by phase shifting the standard maximal-sequence code with individual phase, is the same as a sum of cross-correlations of the standard maximal-sequence code with individual maximal-sequence code.

The difference between the peak value and lowest value of the cross-correlation is a constant value which is determined based on the bit length of the maximal-sequence code, despite varying of the peak value and lowest value of the cross-correlation in correspondance with the convolution number of the maximal-sequence codes.

The inventor worked out this present invention based on the findings.

Figure 4:
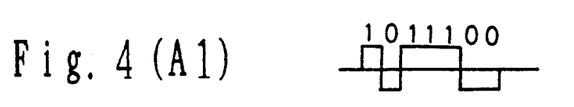

When a standard maximal-sequence code "1 0 1 1 1 0 0" having a bit length of $2^3 - 1$, shown in FIG. 4(A1), is taken into consideration for example, maximal-sequence codes which are phase shifted with $+1$ bit, $+2$ bits and $+4$ bits are "0 1 0 1 1 1 0", "0 0 1 0 1 1 1" and "1 1 0 0 1 0 1" (refer to FIG. 4(B1), 4(C1), 4(D1)). A sequence code which is obtained by convoluting the maximal-sequence codes phase shifted by $+1$ bit, $+2$ bits and $+4$ bits respectively, is shown in FIG. 4(E1). When cross-correlation of these sequence codes with the standard maximal-sequence code is obtained, peaks having the same value as the peak of the auto-correlation (refer to FIG. 4(A2)) are obtained respectively at the phase shifted position by $+1$ bit, $+2$ bits and $+4$ bits (refere to FIGS. 4(B2), 4(C2) and 4(D2)) with respect to the auto-correlation for the maximal-sequence codes which are phase shifted by $+1$ bit, $+2$ bits and $+4$ bits. Furthermore, peaks having lower values than the peak of the auto-correlation are obtained at every phase shifted position by $+1$ bit, $+2$ bits and $+4$ bits (refer to FIG. 4(E2)) with respect to the auto-correlation for the convoluted sequence codes. The peak value of the cross-correlation shown in FIG. 4(E2) is 5, and is lower than the peak values 7 ($=2^3-1$) of the cross-correlation shown in FIGS. 4(B2), 4(C2) and 4(D2) by 2. The value at a position apart from the peak by more than 1 bit is $-3$ in FIG. 4(E2), while each value at positions apart from the peak by more than 1 bit is $-1$, as shown in FIG. 4(B2), 4(C2) and 4(D2). The former value $-3$ is lower than the latter values $-1$ by 2. That is, cross-correlation which is the same as the cross-correlation shown in FIG. 4(E2) is obtained by simply adding the cross-correlations shown in FIGS. 4(B2), 4(C2) and 4(D2). The difference between the maximum value and the minimum value is 8 ($=2^3$) for all cross-correlations. Furthermore, when maximal-sequence codes which are phase shifted by 0 bits to $+6$ bits respectively are added, the peak value of the cross-correlation is 1. The peak value never becomes negative despite varying the peak value in correspondence with the number of maximal sequence codes to be added.

This present invention is made based on the findings mentioned above. The number of current output lines can be determined as 1 (the number of lines is 2 when an earth line is included) in spite of the amount of data output from the SQUIDs by modulating a pseudo noise having strong auto-correlation characteritic with plural modulation signals which are multivalue data and a predetermined standard data, and by supplying the modulated pseudo noises to the modulation coil of each SQUID after phase shifting, the phase of each pseudo noise being different from one another, and by adding the output currents from the superconducting loops of the SQUIDs to obtain an added output signal. In the magnetic flux locked loop side, the original modulation signal can be reproduced by obtaining cross-correlations of the added output signal with pseudo noises which are phase shifted with corresponding quantities, each of which corresponds to each modulation signal to be reproduced, and by performing the operation based on differences between obtained cross-correlations and the cross-correlation of the reproduced standard data and based on the difference between the maximum value and the minimum value.

These and other objectives, features and advantages of the present invention will be more readily understood upon consideration of the present invention, in conjunction with the accompanying drawings.

BRIEF DESCRIPTION OF THE DRAWINGS

FIGS. 4(A1), 4(A2), 4(B1), 4(B2), 4(C1), 4(C2), 4(D1), 4(D2), 4(E1) and 4(E2) are diagrams for explaining newly found characteristics of a maximal-sequence code;

DETAILED DESCRIPTION OF THE PREFERRED EMBODIMENTS

Figure 3:
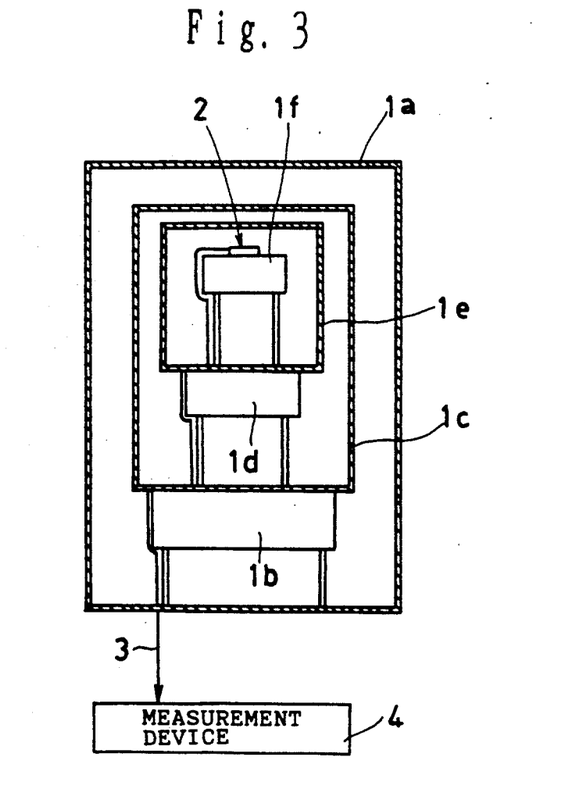
FIG. 3 is a schematic cross sectional view of a refrigeration casing which is applied in a magnetic flux measurement apparatus using SQUIDs.

FIG. 3 is a schematical cross sectional view of a refrigeration casing which is applied to a magnetic flux measurement apparatus using SQUIDs.

The refrigeration casing comprises;

a vacuum casing $1a$, a refrigerator $1b$ for refrigerating to 300 K. (300 Kelvin) which is provided in the vacuum casing $1a$, a shield $1c$ for radiant heat which is supported on the refrigerator $1b$, a refrigerator $1d$ for refrigerating to 70 K. which is provided in a space surrounded by the shield $1c$, a shield $1e$ for radiant heat which is supported on the refrigerator $1d$, a refrigerator $1f$ for refrigerating to 4.2 K. which is provided in a space surrounded by the shield $1e$, plural SQUIDs 2 which are interconnected in parallel and are supported by the refrigerator $1f$, and electrical lines 3 for interconnecting the SQUIDs 2 and a measurement device 4 which is provided exterior of the vacuum casing $1a$.

Figure 1:
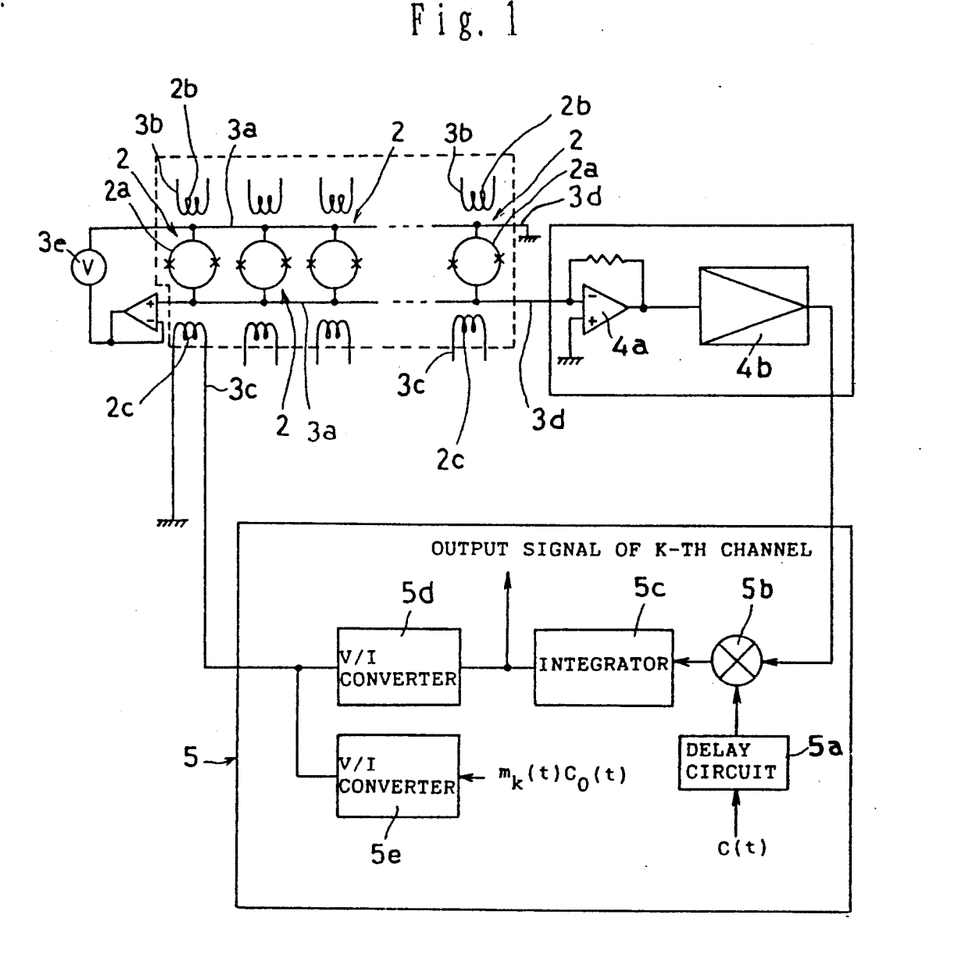
FIG. 1 is an electrical diagram showing an embodiment of a magnetic flux locking apparatus according to the present invention.
Figure 2:
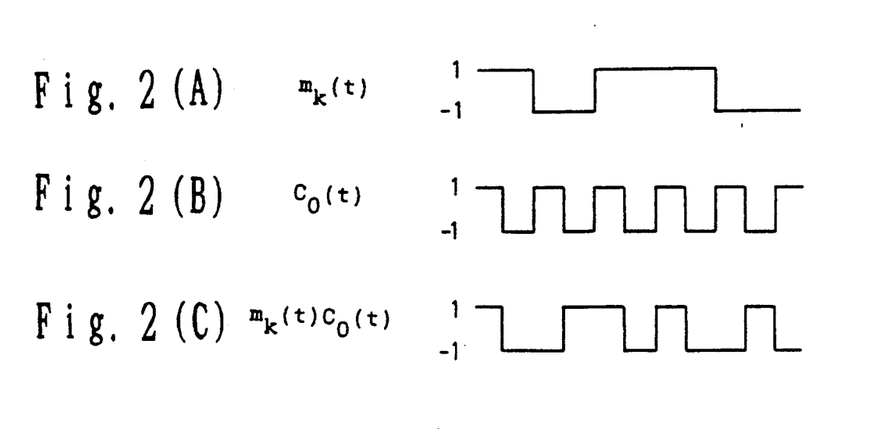
FIGS. 2(A), 2(B) and 2(C) are diagrams illustrating sequence codes.

FIG. 1 is an electrical diagram showing an embodiment of a magnetic flux locking apparatus according to the present invention.

Superconducting loops $2a$ of the plural SQUIDs 2 are interconnected, and an input coil $2b$ and a modulation coil $2c$ of each SQUID 2 are supplied with their own corresponding signals. The plural superconducting loops $2a$ which are interconnected in parallel receive a bias voltage through a pair of bias voltage lines $3a$ by a constant bias voltage applying source $3e$, while the input coils $2b$ receive the input currents through corresponding current input lines $3b$. The modulation coils $2c$ receive the modulation currents through corresponding modulation current lines $3c$. The output currents from the plural superconducting loops $2a$ are added and output through a pair of current output lines $3d$. The output current is transformed into a voltage signal by an operational amplifier $4a$ and the transformed voltage signal is amplified by an amplifier $4b$. The amplified voltage signal is applied to control blocks 5 (one shown) for magnetic flux locking, one control block 5 is provided for each SQUID 2.

Each control block 5 comprises;

a multiplier $5b$ which receives the voltage signal from the amplifier $4b$ and a sequence code given by $$C(t) = C_0(t) \cdot \{m_K(t) - m_0(t)\}$$

through a delay circuit $5a$ which compensates for the propagation delay time, and obtains a multiplication result, an integrator $5c$ for integrating the multiplication result output from the multiplier $5b$ to obtain an integration result and for dividing the integration result by a predetermined number which is determined based on the bit length of the sequence code and the frequency rate of the clock signal $C_0(t)$ and a clock signal of the sequence code $m_K(t)$ to obtain a division result, a voltage-current transformer (hereinafter referred to as V/I converter) $5d$ for transforming the division result into a current signal, and a V/I converter $5e$ for adding the current signal output from the V/I converter $5d$ with a current signal which is obtained by transforming a sequence code given by $m_K(t) \cdot C_0(t)$. Where $m_K(t)$ is a signal obtained by phase shifting a maximal-sequence code by k clock pulses, $m_0(t)$ is a maximal-sequence code having a predetermined phase shifting quantity which is used for modulation of a SQUID 2, and $C_0(t)$ is a clock signal which has a clock frequency that is an integer of the standard clock frequency of the maximal-sequence code (refer to FIG. 2(B)). Variation points of the clock signal $C_0(t)$ are in synchronism and are coincident with the variation points of the maximal-sequence code (refer to FIGS. 2(A) and 2(B)). The maximal-sequence code is a binary code consisting of binary values of "+1" and "−1". As is apparent from FIG. 2(A), the maximal-sequence code is not balanced in the percentages of positive codes and negative codes. As is apparent from FIG. 2(C), the sequence code which is obtained by multiplying the maximal-sequence code and the clock signal $C_0(t)$, is balanced in percentages of positive codes and negative codes.

The convoluted current signal is supplied to the modulation coil $2c$.

The refrigeration casing is illustrated by a dashed line in FIG. 1.

The operation of the magnetic flux locking apparatus having the arrangement mentioned above, is as follows.

The superconducting loops $2a$ of the plural SQUIDs 2 receive the same bias voltage through the pair of bias voltage lines $3a$ by the constant bias voltage applying source $3e$. The input coils $2b$ of the plural SQUIDs 2 are supplied with input currents through the corresponding pairs of current input lines $3b$ respectively, and the modulation coils $2c$ of the plural SQUIDs 2 are supplied with modulation currents through the corresponding pairs of modulation current lines $3c$ respectively. The magnetic flux locking operation is performed by supplying the modulation current to the modulation coil $2c$ for canceling the variations of the magnetic flux guided to the superconducting loop $2a$ by the input coil $2b$.

In this case, the modulation current is not directly supplied to the modulation coil $2c$. The modulation current is supplied to the modulation coil $2c$ after adding the modulation current with the sequence code which is obtained by multiplying a maximal-sequence code that is phase shifted by a predetermined number of clock pulses, and the clock signal $C_0(t)$ so as to balance the percentages of positive codes and negative codes. Then, the current signals output from the corresponding superconducting loops $2a$ are in convoluted condition with the sequence code which is obtained by multiplying the phase-shifted maximal-sequence code and the clock signal $C_0(t)$ in positive-phase-sequence or negative-phase-sequence. The current signal from each superconducting loop $2a$ is not output individually, but the current signals from all superconducting loops $2a$ are added, and the added current signal is output through the pair of current output lines $3d$. The output current signal of the superconducting loop $2a$ of each SQUID 2 should be extracted from the added current signal. To perform the extraction of the output current signal, each control block 5 is provided with the multiplier $5b$ and the integrator $5c$ so as to obtain the original modulation current by obtaining the cross-correlation of the added current signal and the sequence code $C(t)$ by the multiplier $5b$, and by integrating the cross-correlation for one cycle by the integrator $5c$.

It is supposed that a standard output current signal S0 and intermediate output currents S1, S2 and S3 which are samples of multiple value output currents are "0", "0.5", "0.8", and "1", the maximal-sequence code $m_0(t)$ is "1 −1 1 1 1 −1 −1", maximal-sequence codes $m_1(t)$, $m_2(t)$ and $m_3(t)$ which are sequentially phase shifted with 1 bit are "−1 1 −1 1 1 1 −1", "−1 −1 1 −1 1 1 1" and "1 −1 −1 1 1 −1 1 1", the frequency of the clock signal $C_0(t)$ is twice frequency of the standard clock signal of the maximal-sequence code, and the operational amplifier $4a$, the amplifier $4b$ and the V/I converters $5d$ and $5e$ are not taken into consideration for simplification. The clock signal $C_0(t)$ is "1 −1 1 1 −1 1 −1 1 −1 1 −1 1 −1 1 −1" which corresponds to one cycle of the sequence code.

There is no SQUID for actually outputting the standard output current signal S0, but this is equivalent to a SQUID which is parallelly interconnected and which produces such standard output currents "0".

Sequence codes of "0 0 0 0 0 0 0 0 0 0 0 0 0 0", "−0.5 0.5 0.5 −0.5 −0.5 0.5 0.5 −0.5 0.5 −0.5 0.5 −0.5 −0.5 0.5", "−0.8 0.8 −0.8 0.8 0.8 −0.8 −0.8 0.8 0.8 −0.8 0.8 −0.8 0.8 −0.8" and "1 −1 −1 1 1 −1 1 1 1 −1 −1 1 1 1 −1 1 1 −1 1" are output from corresponding SQUIDs and the convoluted sequence code of "−0.3 0.3 −1.3 1.3 −0.7 0.7 0.7 −0.7 0.3 −0.3 2.3 −2.3 1.3 −1.3" is output through the pair of current output lines $3d$. Sequence codes $\{m_1(t)-m_0(t)\}$, $\{m_2(t)-m_0(t)\}$ and $\{m_3(t)-m_0(t)\}$ are "−2 2 −2 0 0 2 0", "−2 0 0 −2 0 2 2" and "0 0 −2 0 −2 2 2". Sequence codes $C(t)$ are "−2 2 2 −2 −2 2 0 0 0 0 2 −2 0 0", "−2 2 0 0 0 0 −2 2 0 0 −2 −2 2 −2" and "0 0 0 0 −2 2 0 0 −2 2 2 −2 2 −2".

When the sequence code $C_0(t) \cdot \{m_1(t)-m_0(t)\}$ is supplied to the multiplier $5b$, the following operations are sequentially performed by the multiplier $5b$ and the integrator $5c$.

$0 + (-0.3)(-2) = 0.6$ $0.6 + (0.3)(2) = 1.2$ $1.2 + (-1.3)(2) = -1.4$ $-1.4 + (1.3)(-2) = -4.0$ $-4.0 + (-0.7)(-2) = -2.6$ $-2.6 + (0.7)(2) = -1.2$ $-1.2 + (0.7)(0) = -1.2$ $-1.2 + (-0.7)(0) = -1.2$ $-1.2 + (0.3)(0) = -1.2$ $-1.2 + (-0.3)(0) = -1.2$ $-1.2 + (2.3)(2) = 3.4$ $3.4 + (-2.3)(-2) = 8.0$ $8.0 + (1.3)(0) = 8.0$ $8.0 + (-1.3)(0) = 8.0$

When the sequence code $C_0(t) \cdot \{m_2(t)-m_0(t)\}$ is supplied to the multiplier $5b$, the following operations are sequentially performed by the multiplier $5b$ and the integrator $5c$.

$0 + (-0.3)(-2) = 0.6$ $0.6 + (0.3)(2) = 1.2$ $1.2 + (-1.3)(0) = 1.2$ $1.2 + (1.3)(0) = 1.2$ $1.2 + (-0.7)(0) = 1.2$ $1.2 + (0.7)(0) = 1.2$ $1.2 + (0.7)(-2) = -0.2$ $-0.2 + (-0.7)(2) = -1.6$ $-1.6 + (0.3)(0) = -1.6$ $-1.6 + (-0.3)(0) = -1.6$ $-1.6 + (2.3)(2) = 3.0$ $3.0 + (-2.3)(-2) = 7.6$ $7.6 + (1.3)(2) = 10.2$ $10.2 + (-1.3)(-2) = 12.8$

When the sequence code $C_0(t) \cdot \{m_3(t) - m_0(t)\}$ is supplied to the multiplier 5b, the following operations are sequentially performed by the multiplier 5b and the integrator 5c.

$0 + (-0.3)(0) = 0$ $0 + (0.3)(0) = 0$ $0 + (-1.3)(0) = 0$ $0 + (1.3)(0) = 0$ $0 + (-0.7)(-2) = 1.4$ $1.4 + (0.7)(2) = 2.8$ $2.8 + (0.7)(0) = 2.8$ $2.8 + (-0.7)(0) = 2.8$ $2.8 + (0.3)(-2) = 2.2$ $2.2 + (-0.3)(2) = 1.6$ $1.6 + (2.3)(2) = 6.2$ $6.2 + (-2.3)(-2) = 10.8$ $10.8 + (1.3)(2) = 13.4$ $13.4 + (-1.3)(-2) = 16.0$

As is apparent from the foregoing, integration results of "8.0", "12.8" and "16.0" are obtained by the integrators 5c of the corresponding control blocks 5. The integrators 5c then divide the integration results by $2^4\{=(2)\cdot(2^3)\}$ to obtain the original intermediate output currents S1, S2 and S3 having the multiple value output currents of "0.5", "0.8", and "1" respectively.

In this case, the number of the bias voltage lines 3a and the number of the current output lines 3d are two respectively, irrespective of the number of SQUIDs 2 which are parallelly interconnected. The total number of lines is decreased from 6n (the conventionally required number) to (4+2n), where n is the number of parallelly interconnected SQUIDs 2. As a result, a large number of parallelly interconnected SQUIDs 2 can be housed in the refrigeration casing so as to remarkably increase the number of SQUIDs 2 which are capable of measuring the magnetic flux simultaneously when the magnetic flux measurement apparatus have a thermal contact similar to that of the conventional SQUID characteristics testing apparatus.

Furthermore, the influence of crosstalk is diffused over the entire extent of the maximal-sequence code, thereby the lowering of the accuracy of magnetic flux measurement is remarkably supressed.

SECOND EMBODIMENT

Figure 6:
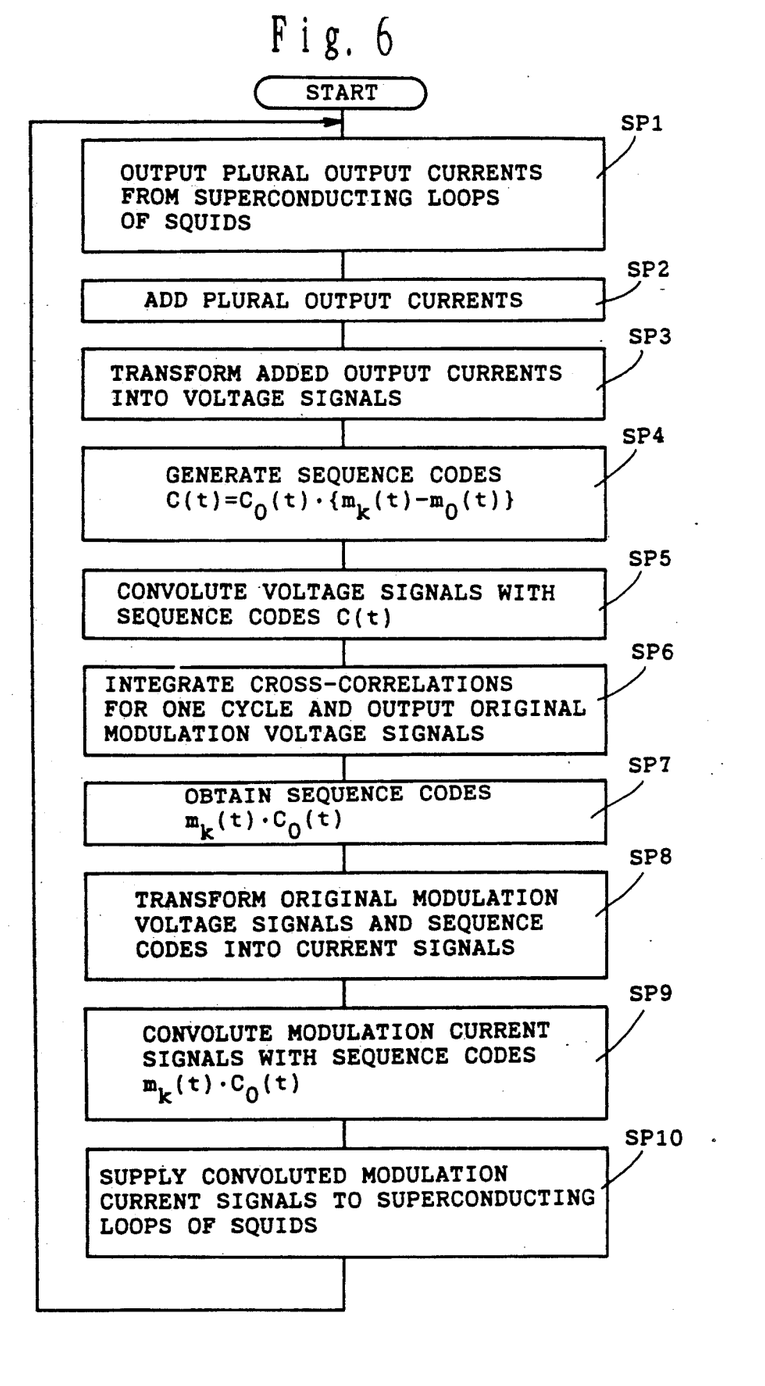
FIG. 6 is a flowchart illustrating an embodiment of a magnetic flux locking method according to the present invention.

FIG. 6 is a flowchart for an embodiment of a magnetic flux locking method according to the present invention.

In step SP1, plural output current signals are output from the superconducting loops 2a of the corresponding SQUIDs 2. In step SP2, the plural output current signals are added and the added output current signal is output from the pair of current output lines 3d. In step SP3, the added output current signal is transformed into a voltage signal and the voltage signal is amplified. In step SP4, sequence codes given by $$C(t) = C_0(t) \cdot \{m_k(t) - m_0(t)\}$$

are generated and are delayed for compensating the propagation delay times in every control block 5, in step SP5, the voltage signals are convoluted with the delayed sequence codes given by $$C(t) = C_0(t) \cdot \{m_k(t) - m_0(t)\}$$

to obtain cross-correlations in every control block 5. In step SP6, the cross-correlations are integrated for one cycle of the sequence codes to obtain and to output the original modulation voltage signals in every control block 5. In step SP7, sequence codes $m_k(t) \cdot C_0(t)$ are obtained by multiplying maximal-sequence codes $m_k(t)$, wherein each maximal-sequence code is phase shifted by a predetermined number of clock pulses, and the clock signal $C_0(t)$ so as to balance the percentages of positive codes and negative codes in every control block 5. In step SP8, the original modulation voltage signals and the sequence codes $m_k(t) \cdot C_0(t)$ are transformed into corresponding current signals respectively in every control block 5. In step SP9, the modulation current signals are convoluted with the sequence codes $m_k(t) \cdot C_0(t)$ in every control block 5. In step SP10, the convoluted modulation current signals are supplied to the corresponding modulation coils 2c through corresponding pairs of current input lines 3c. Thereafter, the operation in step SP1 is carried out again.

When this embodiment is employed also, a large number of parallelly interconnected SQUIDs 2 can be housed in the refrigeration casing so as to remarkably increase the number of SQUIDs 2 which are capable of measuring the magnetic flux simultaneously when the magnetic flux measurement apparatus have a thermal contact similar to that of the conventional SQUID characteristics testing apparatus.

Furthermore, the influence of crosstalk is diffused over the entire extent of the maximal-sequence code, thereby the lowering of the accuracy of magnetic flux measurement is remarkably supressed.

The magnetic flux locking method and apparatus according to the present invention are not limited to the embodiment mentioned above. The magnetic flux locking method and apparatus may perform multiplication and convolution using a pseudo noise having significant auto-correlation characteristics other than the maximal-sequence code, for example random numbers, a balowa-sequence code and the like.

The terms and expressions which have been employed are used as terms of description and not of limitation, and there is no intention, in the use of such terms and expressions, to exclude equivalents of the features shown and described, or portions thereof, it being recognized that various modifications are possible within the scope of the invention as claimed.

What is claimed is:

1. A magnetic flux locking method which maintains a magnetic flux at a superconducting loop of at least one SQUID to a constant magnetic flux by supplying a modulation signal to a modulation coil of said at least one SQUID for compensation for variations in the magnetic flux at said at least one SQUID, said at least one SQUID being housed in a casing which is refrigerated to a temperature below a critical temperature for superconduction, said method comprising the steps of;

(A) applying a same constant-voltage to superconducting loops of plural SQUIDs;

(B) modulating a first pseudo noise for all said plural SQUIDs to compensate for variations in the magnetic flux at said superconducting loop of said at least one SQUID to provide modulated pseudo noise, said first pseudo noise having significant auto-correlation characteristics and being phase shifted by a predetermined quantity;

(C) supplying said modulated pseudo noise to said modulation coil of said at least one SQUID as said modulation signal;

(D) adding output signals from said plural SQUIDs to obtain an added output signal; and (E) demodulating said added output signal for all said plural SQUIDs based on a second pseudo noise which is phase shifted by the same quantity as said first pseudo noise so as to extract the output signal of said at least one SQUID from said added output signal.

2. A magnetic flux locking method as set forth in claim 1, wherein said first and second pseudo noises are modulated so as to balance percentages of positive codes and negative codes.

3. A magnetic flux locking method as set forth in claim 1, wherein said second pseudo noise used in step (E) is obtained based on a difference between said first pseudo noise and a pseudo noise which is phase shifted by a predetermined quantity and which is not used for modulation.

4. A magnetic flux locking method as set forth in claim 1, wherein said first and second pseudo noises are generated based upon a maximal-sequence code which has a code length longer than the total number of SQUIDs in said plurality of SQUIDs.

5. A magnetic flux locking apparatus which maintains a magnetic flux at a superconducting loop of at least one SQUID to a constant magnetic flux by supplying a modulation signal to a modulation coil of said at least one SQUID for compensation for variations in the magnetic flux at said at least one SQUID, said at least one SQUID being housed in a casing which is refrigerated to a temperature below a critical temperature for superconduction, said apparatus comprising;

a constant bias voltage applying source for applying a same constant-voltage to superconducting loops of plural SQUIDs, modulation means for modulating a first pseudo noise for all said SQUIDs to compensate for variations in the magnetic flux at said at least one SQUID to provide modulated pseudo noise, said first pseudo noise having significant auto-correlation characteristics and being phase shifted by a predetermined quantity, output means for adding said output signals of said plural SQUIDs and for outputting an added output signal therefrom, and demodulation means for demodulating said added output signal for all said SQUIDs based on a second pseudo noise, said second pseudo noise being phase shifted by a same quantity as said first pseudo noise so as to extract said output signal of said at least one SQUID from said added output signal.

6. A magnetic flux locking apparatus as set forth in claim 5, wherein said first and second pseudo noises are modulated to balance percentages of positive codes and negative codes.

7. A magnetic flux locking apparatus as set forth in claim 5, wherein said second pseudo noise is obtained based on a difference between said first pseudo noise and another pseudo noise which is phase shifted by a predetermined quantity and which is not used for modulation.

8. A magnetic flux locking apparatus as set forth in claim 5, wherein said first and second pseudo noises are generated based upon a maximal-sequence code which has a code length longer than the total number of SQUIDs in said plurality of SQUIDs.

* * * * *